United States Patent
Chang et al.

(10) Patent No.: US 7,094,653 B2
(45) Date of Patent: Aug. 22, 2006

(54) METHOD FOR FORMING STI STRUCTURES WITH CONTROLLED STEP HEIGHT

(75) Inventors: Yao-Chi Chang, Tainan (TW); Tao-Sheng Chang, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/966,079

(22) Filed: Oct. 14, 2004

(65) Prior Publication Data

US 2006/0084233 A1 Apr. 20, 2006

(51) Int. Cl.
*H01L 21/336* (2006.01)

(52) U.S. Cl. .................. 438/296; 438/295; 438/294

(58) Field of Classification Search ............... 438/296, 438/294, 295
See application file for complete search history.

(56) References Cited

U.S. PATENT DOCUMENTS

| | | | |
|---|---|---|---|
| 6,171,180 B1 * | 1/2001 | Koutny et al. ............ 451/287 |
| 6,281,082 B1 * | 8/2001 | Chen et al. .............. 438/296 |
| 6,319,794 B1 * | 11/2001 | Akatsu et al. ........... 438/424 |
| 6,649,489 B1 * | 11/2003 | Chang et al. ............ 438/424 |
| 6,682,985 B1 * | 1/2004 | Yuzuriha et al. ......... 438/425 |
| 6,777,336 B1 * | 8/2004 | Lin et al. ................ 438/691 |
| 6,787,409 B1 * | 9/2004 | Ji et al. .................. 438/221 |

* cited by examiner

*Primary Examiner*—Thao P. Le
(74) *Attorney, Agent, or Firm*—Duane Morris LLP

(57) ABSTRACT

STI structures with step height control are produced using a relatively thin nitrogen-containing layer formed over a substrate. The nitrogen-containing layer may consist of SiN and SiON films with a combined thickness of 900 angstroms or less. Trench openings are formed to extend through the nitrogen-containing layer and into the substrate. Chemical vapor deposition is used to form a dielectric such as an oxide within the trench openings and over the top surface of the nitrogen-containing layer. A polishing operation is used to partially polish the CVD dielectric layer leaving a reduced thickness over the nitrogen-containing layer, and then a dry etch is used to remove the dielectric from over the nitrogen-containing layer and uniformly recede the top surface of the dielectric within the trench. Dishing effects are avoided. The nitrogen-containing layer is removed to produce STI structures with step heights of less than 500 angstroms.

22 Claims, 4 Drawing Sheets

METHOD FOR FORMING STI STRUCTURES WITH CONTROLLED STEP HEIGHT

FIELD OF THE INVENTION

The present invention relates to a method for forming isolation structures in semiconductor integrated circuits.

BACKGROUND

The advent of ultra large scale integrated (ULSI) circuits has allowed semiconductor manufacturers worldwide to fabricate semiconductor devices to extremely compact dimensions. The highly integrated devices thereby require the tightly packed device features to be electrically isolated from one another. The fabrication process for forming such integrated circuits therefore includes the formation of isolation structures within the semiconductor device. In order to fabricate such a highly integrated circuit, isolation structures are typically formed as STI (shallow trench isolation) structures in the silicon or other semiconductor substrate. Such isolation structures are a requirement because even a small amount leakage in a ULSI integrated circuit can induce significant power dissipation and/or failure of the circuit.

STIs are typically produced by depositing layers over a semiconductor substrate surface and forming a trench extending through the layers and into the semiconductor substrate, filling the trench with a dielectric that is also formed above the layers, then polishing. The dielectric is typically formed using chemical vapor deposition (CVD) and is commonly an oxide. Chemical mechanical polishing is advantageously used to remove the dielectric layer from over the layers, the upper one of which is a polishing-stop layer such as silicon nitride layer or other materials. The polishing terminates when the deposited dielectric is removed from over the polishing-stop layer. A shortcoming associated with conventional STI formation methods, in particular with the CMP operation used for polishing a CVD dielectric file, is "dishing." A dishing effect is created when the CVD oxide being polished takes on a depressed concave shape as it becomes recessed below the polishing-stop surface because the CVD oxide polishes at a rate faster than the polishing-stop surface. Dishing creates problems in subsequent films formed over the structure and also impacts the control of subsequent implantation processes. STI Structures are especially susceptible to dishing is when STI structures of different widths are being formed at the same time in the same polishing operation. The effects of dishing are particularly problematic when the convex top surface produced by polishing extends well above the substrate surface. This occurs when the layers formed over the substrate and used during the polishing operation including the polishing stop layer, are of considerable thickness.

It would therefore be desirable to produce STI structures that are free of any dishing effects and in which the STI structures include a substantially planar top surface that protrudes above the substrate surface to a lesser extent than prior art structures.

SUMMARY OF THE INVENTION

According to one aspect, provided is a method for forming an isolation structure in a semiconductor device. The method includes providing a substructure of a substrate and a nitrogen-containing layer disposed on the substrate, etching through the nitrogen-containing layer and into the substrate thereby forming a trench, forming a dielectric over the nitrogen-containing layer and filling the trench, polishing the dielectric to reduce a thickness of the dielectric over the nitrogen-containing layer such that the dielectric remains covering the nitrogen-containing layer, using an etch procedure to remove the dielectric from over the nitrogen-containing layer and to substantially uniformly recede a top surface of the dielectric below a top surface of the nitrogen-containing layer in the trench, and, removing the nitrogen-containing layer.

According to another aspect, provided is a method for forming an isolation structure in a semiconductor device. The method involves providing a substructure comprising an SiON layer disposed on a silicon nitride layer disposed on a silicon substrate, the SiON layer and the silicon nitride layer having a combined thickness no greater than 900 angstroms, etching through the SiON layer, the silicon nitride layer and into the silicon substrate thereby forming a trench having sidewalls formed of the substrate, the silicon nitride layer and the SiON layer, forming a dielectric filling the trench and over the SiON layer, polishing to reduce a thickness of the dielectric over the SiON layer such that the dielectric remains over the SiON layer, using an oxide etch procedure to remove the dielectric from over the SiON layer and to substantially uniformly recede a top surface of the dielectric below a top surface of the SiON layer in the trench, and removing the SiON layer and the silicon nitride layer.

According to yet another aspect, provided is a method for forming isolation structures in a semiconductor device. The method involves providing a substructure of a nitrogen-containing layer disposed on a surface of a silicon substrate, etching a plurality of openings of different widths through the nitrogen-containing layer and into the silicon substrate thereby forming a corresponding plurality of trenches having different widths, forming a dielectric over the nitrogen-containing layer and filling the plurality of trenches, polishing the dielectric to reduce a thickness of the dielectric over the nitrogen-containing layer and whereby the dielectric remains over the nitrogen-containing layer, using an etch procedure to remove the dielectric from over the nitrogen-containing layer and to substantially uniformly recede a top surface of the dielectric below a top surface of the nitrogen-containing layer in each of the plurality of trenches such that the top surface is no more than about 500 angstroms above the surface of the silicon substrate, and removing the nitrogen-containing layer to form an isolation structure in each of the plurality of trenches, each isolation structure including the top surface as a top portion thereof and disposed no more than about 500 angstroms above the surface of the silicon substrate.

BRIEF DESCRIPTION OF THE DRAWING

The present invention is best understood from the following detailed description when read in conjunction of the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing. Included in the drawing are the following figures.

DETAILED DESCRIPTION

Figure 1:
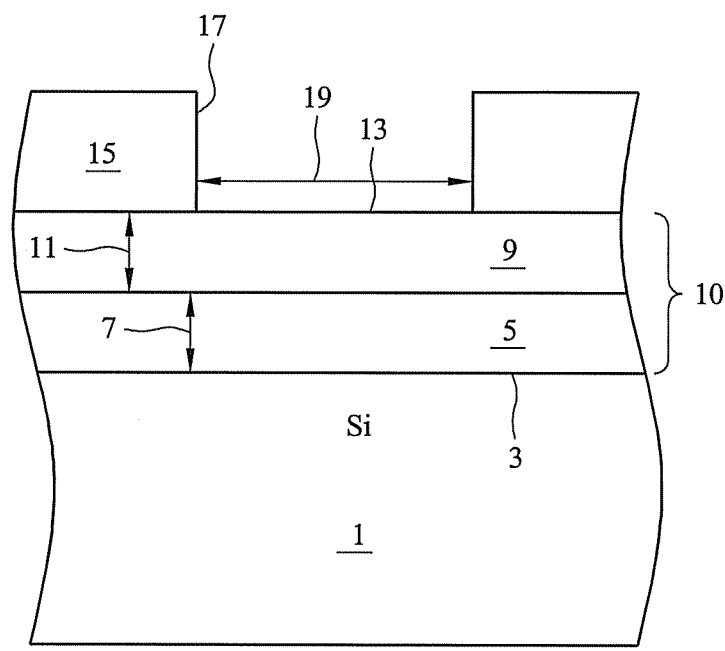
FIGS. 1–6 are cross sectional views and illustrate a sequence of processing operations used to form an exemplary shallow trench isolation structure.

FIG. 1 is a cross sectional view showing nitrogen-containing layer 10 consisting of silicon oxynitride, SiON layer 9 disposed on silicon nitride, SiN layer 5 in the exemplary embodiment. SiN layer 5 of nitrogen-containing layer 10 is disposed on substrate surface 3 of substrate 1. Nitrogen-containing layer 10 may include at least one of an SiON layer and a silicon nitride layer in various combinations and may include a plurality of individual nitrogen-containing films. Other nitrogen-containing materials may be used in other exemplary embodiments and the invention is not limited to the illustrated exemplary embodiment of SiON layer 9 and silicon nitride layer 5. Substrate 1 is a semiconductor material and may be silicon in an exemplary embodiment but in other exemplary embodiments, substrate 1 may be gallium arsenide or other suitable materials. SiN layer 5 includes thickness 7 which may be about 500 angstroms in one exemplary embodiment but may range from 450–550 angstroms in another exemplary embodiment. In still other exemplary embodiments, thickness 7 may take on other values. SiON layer 9 includes thickness 11 which may be about 320 angstroms in one exemplary embodiment. In other exemplary embodiments, thickness 11 of SiON layer 9 may range from 220–420 angstroms. The combination of thickness 7 and thickness 11, i.e. the thickness of nitrogen-containing layer 10, may advantageously be less than 900 angstroms in one exemplary embodiment but other combined thicknesses may be used. Over top surface 13 of SiON layer 9 of nitrogen-containing layer 10, photoresist film 15 is formed to include opening 17. Opening 17 will be used to define a trench that will be formed in the substructure of SiON layer 9, SiN layer 5 and substrate 1. Opening 17 includes width 19. In one exemplary embodiment, width 19 may be 1500 angstroms but width 19 may vary in other exemplary embodiments. Within a single integrated circuit device being formed on a substrate, a plurality of trenches having a plurality of different widths may be formed to produce isolation structures having a plurality of different widths. A sequence of etch processes is then used to etch through SiON layer 9, SiN layer 5, and into substrate 1 to form a trench opening such as shown in FIG. 2.

Figure 2:
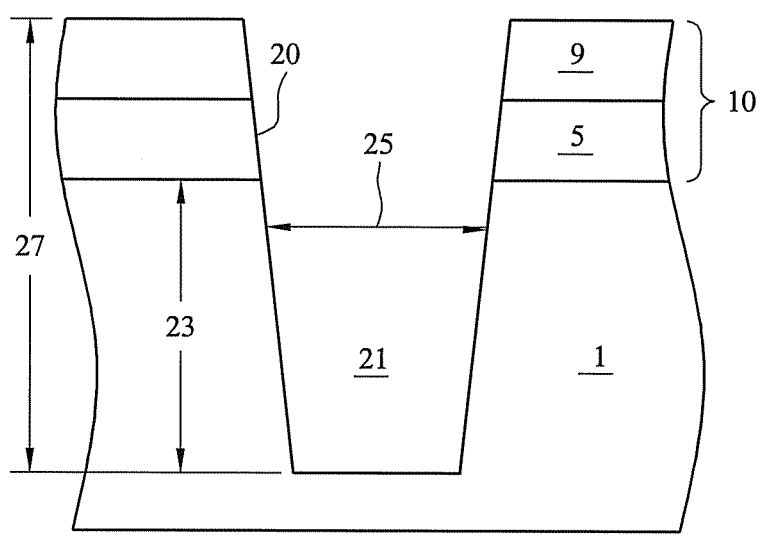
Figure 3:
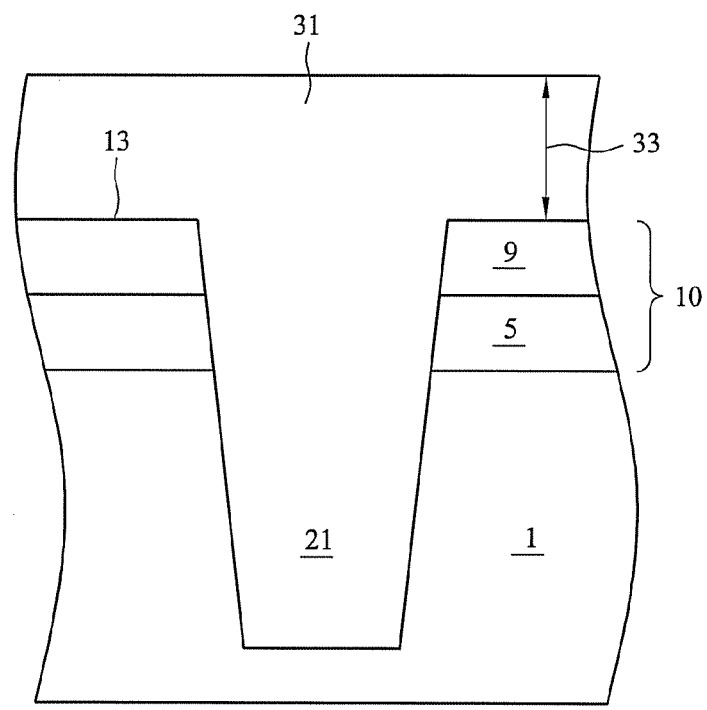

FIG. 2 shows trench opening 21 having average width 25 and extending through SiON layer 9, SiN layer 5 and into substrate 1. Average width 25 may range from 1000 to 4000 angstroms in other exemplary embodiments. In one exemplary embodiment, substrate depth 23 may be around 3000 angstroms meaning that trench 21 extends 3000 angstroms into substrate 1 but different depths may be used in other exemplary embodiments. Because nitrogen-containing layer 10, i.e. SiN layer 5 and SiON layer 9, is thinner than conventional layers, the aspect ratio of trench opening 21 is reduced relative to conventional trenches. In an exemplary embodiment in which SiON layer 9 includes a thickness of 320 angstroms, SiN layer 5 includes a thickness of 500 angstroms, depth 23 is 3000 angstroms and average width 25 is 1500 angstroms the aspect ratio of trench 21 is 2.55. The aspect ratio is the ratio of the overall depth 27 of opening to the average width 25. In comparison, conventional trench openings in which substrate depth 23 is the same and in which conventional silicon nitride layers having a thickness three to five times greater than the thickness of SiN layer 5 are used, the aspect ratio will be much higher, for example 3.3 or higher. Although the illustrated trench opening 21 has somewhat tapered sidewalls, it should be understood that in other exemplary embodiments, trench opening 21 may have essentially vertical sidewalls. Sidewalls 20 of trench opening 21 include portions of substrate 1, SiN layer 5 and SiON layer 9.

Dielectric material 31 is then deposited to fill opening 21 and includes thickness 33 over top surface 13 of SiON layer 9. Thickness 33 may be 5000 angstroms or greater according to various exemplary embodiments. Dielectric material 31 may be formed using chemical vapor deposition, CVD, and may advantageously be formed using HDP (high density plasma) CVD. Dielectric material 31 may advantageously be an oxide or various other suitable dielectric materials.

Figure 4:
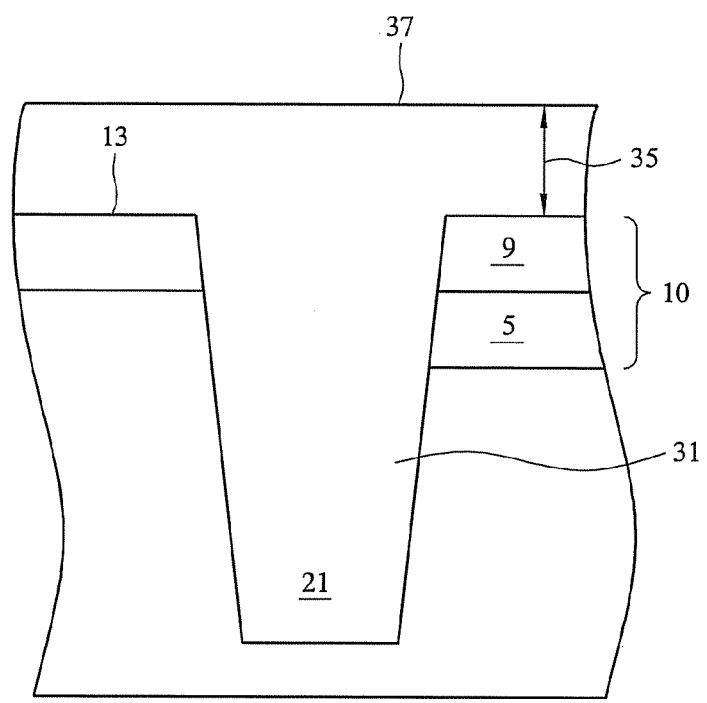

The thickness of dielectric material 31 is then reduced by a polishing process which may be chemical mechanical polishing, CMP, to form the structure shown in FIG. 4. The structure of FIG. 4 includes reduced thickness 35 which may be about 2000 angstroms or less in an exemplary embodiment. After the partial polishing/thickness reduction step, a plasma etching operation is used to remove dielectric material 31 from over top surface 13 of SiON layer 9 and produce the structure shown in FIG. 5. In an exemplary embodiment in which dielectric material 31 is an oxide, a dry oxide etch may be used. Conventional dry oxide etching operations such as an RIE plasma etch may be used. Various suitable tools are available to conduct such oxide etch operations.

Figure 5:
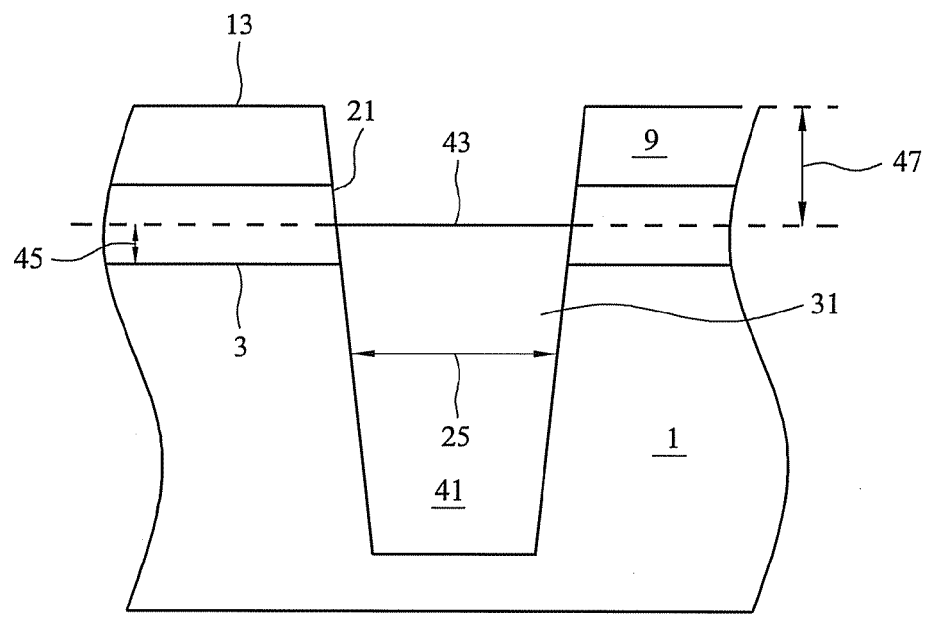

FIG. 5 shows dielectric material 31 having top surface 43 which is receded below top surface 13 of SiON layer 9, by distance 47. It can also be seen that dielectric material 31 is removed from over top surface 13. Receded top surface 43 is disposed above substrate surface 3 by distance 45. In one exemplary embodiment, distance 47 may be about 300–500 angstroms and distance 45 may also be about 300–500 angstroms but other distances may be achieved in other exemplary embodiments. In one particular exemplary embodiment, distance 45 may be 0. The recessed structure of FIG. 5 is accomplished using an oxide etch operation in which an endpoint condition is indicated when dielectric 31 is completely removed from over top surface 13. An overetch portion is then used to recede top surface 43 below top surface 13 of SiON layer 9, by distance 47. It is an aspect of the present invention that dielectric 31 is substantially uniformly receded and that top surface 43 is substantially planar and parallel to substrate surface 3. Additionally, when a plurality of STI structures having different widths are formed in substrate 1 at the same time and using the same set of processing operations, an aspect of the invention is that the distance 47 that top surface 43 is receded below top surface 13 and its distance 45 above substrate surface 3, will be essentially the same for each of the plurality of trenches regardless of the average width 25 of trench opening 21, which may range from 1000 angstroms to 4000 or 5000 angstroms in various exemplary embodiments. This will be shown in FIG. 7.

Figure 6:
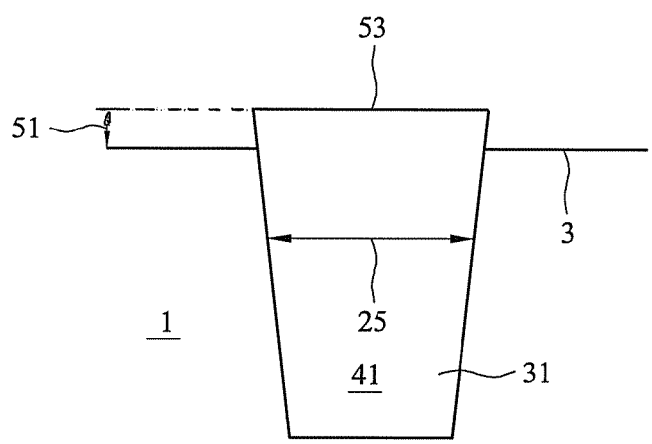

FIG. 6 shows STI structure 41 formed of dielectric material 31 after conventional etching operations such as one or more wet etching operations are used to remove nitrogen-containing layer 10. According to the exemplary embodiment in which nitrogen-containing layer 10 is composed of SiON layer 9 and SiN layer 5, a sequence of wet etching operations sequentially remove SiON layer 9 and SiN layer 5 to expose substrate surface 3 of substrate 1. STI structure 41 includes top surface 43 which includes a step height 51 above substrate surface 3. Step height 51 may range from 0 to 500 angstroms in various exemplary embodiments, and will advantageously be 300 angstroms or less. An advantage of the present invention is that step height 51 is reduced relative to conventional STI structures and top surface 43 is substantially planar and do not exhibit dishing effects. It is a further advantage of the present invention that the aforementioned attributes of step height 51 and top surface 43 hold consistently true for STI structures formed at the same time in a semiconductor device regardless of the average width of the STI structure which may vary for the various STI structures formed throughout a semiconductor device.

Figure 7:
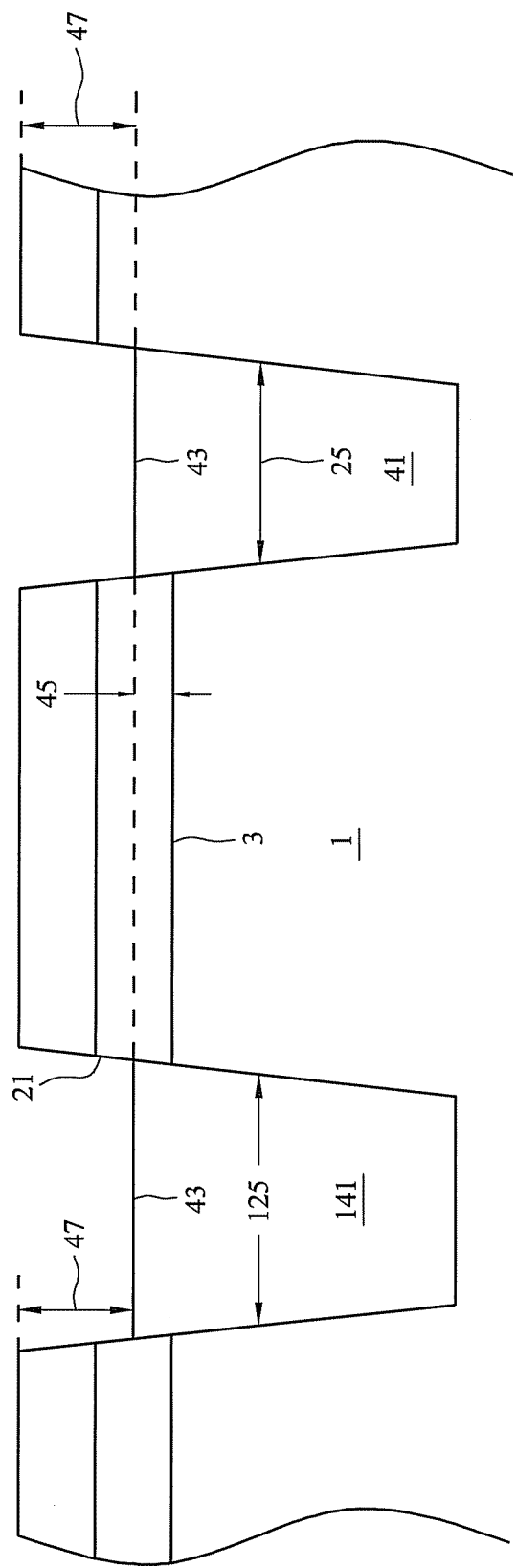
FIG. 7 is a cross sectional view at the same processing stage as illustrated in FIG. 5 and illustrates another exemplary embodiment with multiple shallow trench isolation structures.

FIG. 7 shows STI structures 41 and 141 formed in the same substrate 1 according to the processing sequence shown in FIGS. 1–5, and having different widths 25 and 125, respectively. FIG. 7 shows that top surface 43 of each of the STI structures 41 and 141 is uniformly receded the same distance 47 below top surface 13 and disposed the same distance 45 above substrate surface 3.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for forming an isolation structure in a semiconductor device comprising:
   providing a substructure of a substrate and a nitrogen-containing layer disposed on said substrate;
   etching through said nitrogen-containing layer and into said substrate thereby forming a trench;
   forming a dielectric over said nitrogen-containing layer and filling said trench;
   polishing said dielectric to reduce a thickness of said dielectric over said nitrogen-containing layer such that said dielectric remains covering said nitrogen-containing layer;
   after said polishing, using an etch procedure to remove said dielectric from over said nitrogen-containing layer and to substantially uniformly recede a top surface of said dielectric below a top surface of said nitrogen-containing layer in said trench; and
   removing said nitrogen-containing layer.

2. The method as in claim 1, wherein said nitrogen-containing layer comprises at least one of a silicon nitride layer and a silicon oxynitride layer.

3. The method as in claim 1, wherein said nitrogen-containing layer includes a silicon nitride layer having a thickness no greater than 550 angstroms disposed over a silicon oxynitride layer.

4. The method as in claim 1, wherein said forming a dielectric comprises depositing said dielectric having a thickness greater than 2000 angstroms over said nitrogen-containing layer and said polishing reduces said thickness to not more than 2000 angstroms over said nitrogen-containing layer.

5. The method as in claim 4, wherein said depositing comprises chemical vapor deposition.

6. The method as in claim 1, wherein said etching forms said trench having sidewalls formed of said substrate and said nitrogen-containing layer and said trench includes an aspect ratio no greater than 2.6:1.

7. The method as in claim 1, wherein said nitrogen-containing layer has a thickness no greater than 900 angstroms.

8. The method as in claim 1, wherein said using an etch recedes said top surface of said dielectric to a height no more than about 500 angstroms above a surface of said silicon substrate.

9. The method as in claim 1, wherein said removing results in said top surface of said dielectric being substantially parallel to, and no more than 300 angstroms above, a surface of said silicon substrate.

10. The method as in claim 1, wherein said etch comprises a plasma oxide etch operation.

11. The method as in claim 1, further comprising said etching comprising etching a plurality of trenches having different widths through said nitrogen-containing layer and into said silicon substrate, wherein said forming a dielectric includes forming said dielectric in each of said plurality of trenches, and wherein said removing produces a corresponding plurality of isolation structures, each of said isolation structures formed of said dielectric and including a substantially planar upper surface, each of said planar upper surfaces extending substantially the same height above a surface of said silicon substrate.

12. The method as in claim 11, wherein each of said plurality of isolation structures includes a corresponding one of said top surfaces disposed no more than about 500 angstroms above said surface of said silicon substrate.

13. The method as in claim 1, wherein said polishing comprises chemical mechanical polishing.

14. The method as in claim 1, wherein said dielectric comprises an oxide and said etch procedure is an oxide etch procedure.

15. A method for forming an isolation structure in a semiconductor device comprising:
   providing a substructure comprising an SiON layer disposed on a silicon nitride layer disposed on a silicon substrate, said SiON layer and said silicon nitride layer having a combined thickness no greater than 900 angstroms;

etching through said SiON layer, said silicon nitride layer and into said silicon substrate thereby forming a trench having sidewalls formed of said substrate, said silicon nitride layer and said SiON layer;

forming a dielectric filling said trench and over said SiON layer;

polishing to reduce a thickness of said dielectric over said SiON layer such that said dielectric remains over said SiON layer;

after said polishing, using an oxide etch procedure to remove said dielectric from over said SiON layer and to substantially uniformly recede a top surface of said dielectric below a top surface of said SiON layer in said trench; and removing said SiON layer and said silicon nitride layer.

16. The method as in claim 15, wherein said using an oxide etch recedes said top surface to a height no more than about 500 angstroms above said silicon substrate.

17. The method as in claim 15, wherein said removing results in said top surface of said dielectric being substantially parallel to, and no more than 300 angstroms above, a surface of said silicon substrate.

18. The method as in claim 15, wherein said forming a dielectric comprises chemical vapor deposition and said polishing comprises chemical mechanical polishing.

19. A method for forming isolation structures in a semiconductor device comprising:

providing a substructure of a nitrogen-containing layer disposed on a surface of a silicon substrate;

etching a plurality of openings of different widths through said nitrogen-containing layer and into said silicon substrate thereby forming a corresponding plurality of trenches having different widths;

forming a dielectric over said nitrogen-containing layer and filling said plurality of trenches;

polishing said dielectric to reduce a thickness of said dielectric over said nitrogen-containing layer and whereby said dielectric remains over said nitrogen-containing layer;

after said polishing, using an etch procedure to remove said dielectric from over said nitrogen-containing layer and to substantially uniformly recede a top surface of said dielectric below a top surface of said nitrogen-containing layer in each of said plurality of trenches such that said top surface is no more than about 500 angstroms above said surface of said silicon substrate; and removing said nitrogen-containing layer to form an isolation structure in each of said plurality of trenches, each isolation structure including said top surface as a top portion thereof and disposed no more than about 500 angstroms above said surface of said silicon substrate.

20. The method as in claim 19, wherein said widths range from 1000 to 4000 angstroms.

21. The method as in claim 19, wherein said forming a dielectric comprises chemical vapor deposition and said polishing comprises chemical mechanical polishing.

22. The method as in claim 19, wherein said nitrogen-containing layer has a thickness no greater than 900 angstroms and is composed of a SiON layer disposed on a silicon nitride layer.

* * * * *